US011393859B2

(12) United States Patent
Jo et al.

(10) Patent No.: US 11,393,859 B2
(45) Date of Patent: Jul. 19, 2022

(54) IMAGE SENSOR PACKAGE

(71) Applicant: SAMSUNG ELECTRONICS CO., LTD., Suwon-si (KR)

(72) Inventors: Sungeun Jo, Suwon-si (KR); Youngshin Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 247 days.

(21) Appl. No.: 16/667,041

(22) Filed: Oct. 29, 2019

(65) Prior Publication Data

US 2020/0373341 A1   Nov. 26, 2020

(30) Foreign Application Priority Data

May 20, 2019 (KR) .................. 10-2019-0058787

(51) Int. Cl.
*H01L 27/146* (2006.01)
*H01L 23/00* (2006.01)

(52) U.S. Cl.
CPC ........ *H01L 27/14618* (2013.01); *H01L 24/06* (2013.01); *H01L 24/48* (2013.01);
(Continued)

(58) Field of Classification Search
CPC ......... H01L 27/14618; H01L 27/14636; H01L 24/48; H01L 24/49; H01L 24/06; H01L 2224/06165; H01L 2224/48227; H01L 2224/06155; H01L 2224/49171; H01L 2224/73265; H01L 23/3157; H01L 2224/8592; H01L 2224/29015; H01L 2224/83192; H01L 2224/83193; H01L 2224/32058; H01L 2224/29013; H01L 2224/05568; H01L 2224/73215; H01L 2224/32225; H01L 2224/29011; H01L 2224/06135; H01L 2224/06131;
(Continued)

(56) References Cited

U.S. PATENT DOCUMENTS 7,276,393 B2   10/2007   Derderian et al.
7,511,374 B2   3/2009   Derderian et al.
(Continued)

*Primary Examiner* — Shahed Ahmed
*Assistant Examiner* — Sun Mi Kim King
(74) *Attorney, Agent, or Firm* — Lee IP Law, P.C.

(57) ABSTRACT

An image sensor package including an image sensor chip including an active pixel sensor region and a non-sensing region, a plurality of chip pads being in the non-sensing region; a printed circuit board on one side of the image sensor chip, the printed circuit board including a plurality of bonding pads; conductive wires respectively connecting the plurality of chip pads to the plurality of bonding pads; a bonding dam at a periphery of the active pixel sensor region; a cover glass on the bonding dam and facing another side of the image sensor chip; and an encapsulation layer covering a side surface of the bonding dam, a side surface of the cover glass, an edge of a lower surface of the cover glass, the non-sensing region, and an edge of an upper surface of the printed circuit board, wherein the bonding dam is spaced apart from an end of a side surface of the image sensor chip by a distance of 80 μm to 150 μm has a height of 50 μm to 150 μm from the image sensor chip, and has a width of 160 μm to 240 μm.

16 Claims, 6 Drawing Sheets

(52) U.S. Cl.
CPC ........ *H01L 24/49* (2013.01); *H01L 27/14636* (2013.01); *H01L 2224/06155* (2013.01); *H01L 2224/06165* (2013.01); *H01L 2224/48227* (2013.01); *H01L 2224/49171* (2013.01)

(58) Field of Classification Search
CPC . H01L 2224/48229; H01L 2224/04042; H01L 2224/49175; H01L 27/14605; H01L 27/14625; H01L 23/04; H01L 23/31; H01L 24/46; H01L 23/3142; H01L 27/1462

See application file for complete search history.

(56) References Cited

U.S. PATENT DOCUMENTS

| | | |
|---|---|---|
| 7,691,660 B2 | 4/2010 | Derderian et al. |
| 7,939,361 B2 | 5/2011 | Honda |
| 8,269,300 B2 | 9/2012 | Chien et al. |
| 9,419,033 B2 | 8/2016 | Hsu et al. |
| 9,966,401 B2 | 5/2018 | Jun |
| 10,032,824 B2 | 7/2018 | Deng et al. |
| 2005/0082490 A1 | 4/2005 | Perillat |
| 2006/0098244 A1 | 5/2006 | Choi et al. |
| 2007/0108544 A1 | 5/2007 | Tu et al. |
| 2017/0012069 A1* | 1/2017 | Rudmann ......... H01L 27/14687 |
| 2018/0233425 A1* | 8/2018 | Yu ........................... H01L 24/02 |
| 2018/0308890 A1 | 10/2018 | Wang et al. |

* cited by examiner

IMAGE SENSOR PACKAGE

CROSS-REFERENCE TO RELATED APPLICATION

Korean Patent Application No. 10-2019-0058787, filed on May 20, 2019, in the Korean Intellectual Property Office, and entitled: "Image Sensor Package," is incorporated by reference herein in its entirety.

BACKGROUND

1. Field

Embodiments relate to an image sensor package.

2. Description of the Related Art

An area of a pixel region increases and an area of a non-sensing region decreases as a resolution of an image sensor increases.

SUMMARY

The embodiments may be realized by providing an image sensor package including an image sensor chip including an active pixel sensor region and a non-sensing region, a plurality of chip pads being in the non-sensing region; a printed circuit board on one side of the image sensor chip, the printed circuit board including a plurality of bonding pads; conductive wires respectively connecting the plurality of chip pads to the plurality of bonding pads; a bonding dam at a periphery of the active pixel sensor region; a cover glass on the bonding dam and facing another side of the image sensor chip; and an encapsulation layer covering a side surface of the bonding dam, a side surface of the cover glass, an edge of a lower surface of the cover glass, the non-sensing region, and an edge of an upper surface of the printed circuit board, wherein the bonding dam is spaced apart from an end of a side surface of the image sensor chip by a distance of 80 µm to 150 µm, has a height of 50 µm to 150 µm from the image sensor chip, and has a width of 160 µm to 240 µm.

The embodiments may be realized by providing an image sensor package including an image sensor chip including an active pixel sensor region and a non-sensing region, a plurality of chip pads being in the non-sensing region; a printed circuit board on one side of the image sensor chip, the printed circuit board including a plurality of bonding pads; conductive wires respectively connecting the plurality of chip pads to the plurality of bonding pads; a bonding dam at a periphery of the active pixel sensor region and covering one or more of the plurality of chip pads; a cover glass on the bonding dam and facing another side of the image sensor chip; and an encapsulation layer covering a side surface of the bonding dam, a side surface of the cover glass, and an edge of an upper surface of the printed circuit board, wherein the non-sensing region has a width of 345 µm to 435 µm.

The embodiments may be realized by providing an image sensor package including an image sensor chip including an active pixel sensor region and a non-sensing region, a plurality of chip pads being in the non-sensing region; a printed circuit board on one side of the image sensor chip, the printed circuit board including a plurality of bonding pads; conductive wires respectively connecting the plurality of chip pads to the plurality of bonding pads; a first bonding dam at a periphery of the active pixel sensor region; a second bonding dam in a region of the non-sensing region in which no chip pad is formed; a cover glass on the first bonding dam and the second bonding dam, and facing another side of the image sensor chip; and an encapsulation layer covering a side surface of the first bonding dam, a side surface of the second bonding dam, a side surface of the cover glass, an edge of a lower surface of the cover glass, the non-sensing region, and an edge of an upper surface of the printed circuit board.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
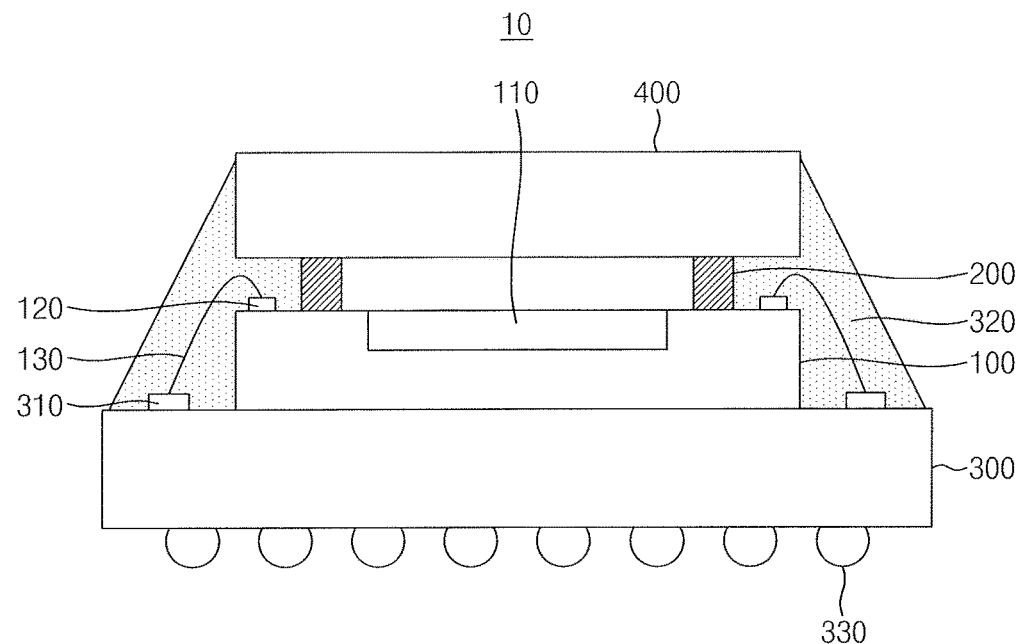
FIG. 1 illustrates a cross-sectional view of an image sensor package according to an example embodiment.
Figure 2:
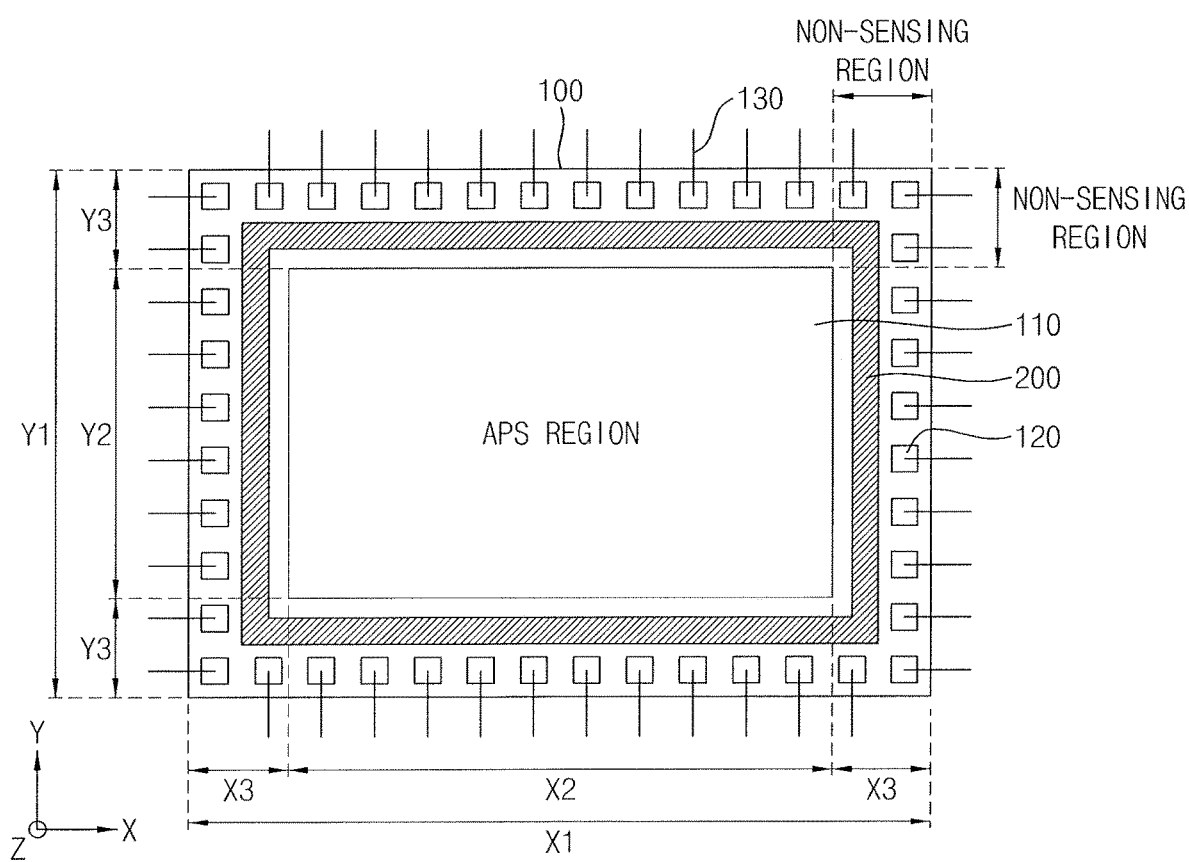
FIG. 2 illustrates a plan view of a bonding dam between an active pixel sensor (APS) region and a non-sensing region.

FIG. 1 illustrates a cross-sectional view of an image sensor package 10 according to an example embodiment. FIG. 2 illustrates a plan view of a bonding dam formed between an active pixel sensor (APS) region and a non-sensing region.

Referring to FIGS. 1 and 2, the image sensor package 10 according to the example embodiment may include an image sensor chip 100, a bonding dam 200, a printed circuit board (PCB) 300, and a cover glass 400.

The image sensor chip 100 may include an APS region 110 (in which a plurality of unit pixels are in an array form) and a non-sensing region. The non-sensing region may be at a periphery of the APS region 110. For example, the non-sensing region may be at edges of the image sensor chip 100 to surround the APS region 110. A plurality of chip pads 120 may be in the non-sensing region. The plurality of chip pads 120 may be formed of a conductive metal (e.g., aluminum).

In an implementation, the image sensor chip 100 may be a back-side illumination (BSI) type, and the APS region 110 and the plurality of chip pads 120 may be formed on a first surface (e.g., a back surface) of a semiconductor substrate. In an implementation, the image sensor chip 100 may be a front side illumination (FSI) type, and the APS region 110 and the plurality of chip pads 120 may be formed on a second surface (e.g., a front surface) of the semiconductor substrate.

In an implementation, each of the plurality of unit pixels may sense light using a photodiode (PD) and convert the sensed light into an electrical signal to generate an image signal. In an implementation, each of the plurality of unit pixels may include a complementary metal-oxide-semiconductor (CMOS) image sensor. In an implementation, each of the plurality of unit pixels may include a charge coupled device (CCD) image sensor.

Figure 3:
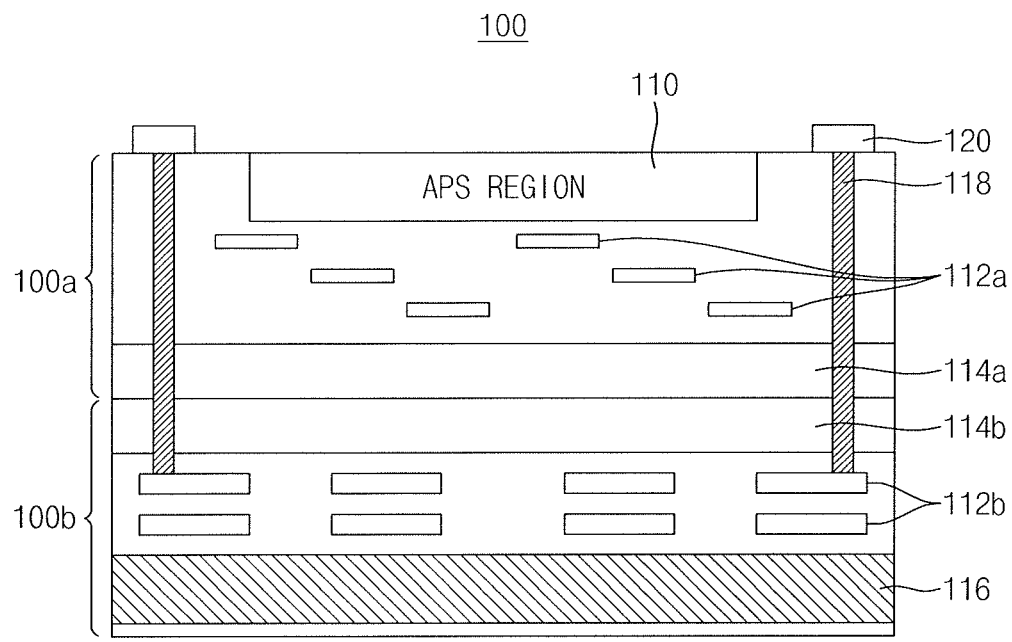
FIG. 3 illustrates a view showing the image sensor chip formed by stacking a plurality of substrates.

FIG. 3 illustrates a view of the image sensor chip 100 formed by stacking a plurality of substrates.

Referring to FIG. 3, a first substrate 100a and a second substrate 100b may be bonded together to form the image sensor chip 100. An APS region 110, a plurality of first interconnections 112a, and a first insulating layer 114a may be on or in the first substrate 100a. A plurality of second interconnections 112b, a second insulating layer 114b, and a driving circuit 116 for driving unit pixels of the APS region 110 may be on or in the second substrate 100b. The first substrate 100a and the second substrate 100b may be electrically connected to each other through a plurality of through silicon vias (TSVs) 118. The plurality of chip pads 120 may be on or near edges of an upper surface of the first substrate 100a (e.g., a surface facing away from the second substrate 100b) and connected to the plurality of second interconnections 112b of the second substrate 100b through the TSVs 118. In addition, the plurality of first interconnections 112a of the first substrate 100a may be connected to the plurality of second interconnections 112b of the second substrate 100b through the TSVs 118.

Referring to FIGS. 1 and 2, the bonding dam 200 may be between the image sensor chip 100 and the cover glass 400 to bond the image sensor chip 100 to the cover glass 400. The bonding dam 200 may extend between the image sensor chip 100 and the cover glass 400 along a Z-axis direction. In an implementation, the image sensor chip 100 and the cover glass 400 may have the same dimensions (e.g., length and width) in the X-axis and Y-axis directions. In an implementation, the cover glass 400 may have a dimension (e.g., length or width) that is greater than that of the image sensor chip 100 in the X-axis direction or Y-axis direction. In an implementation, the cover glass 400 may have a thickness of, e.g., 200 µm to 500 µm along the Z-axis direction.

A plurality of bonding pads 310 may be on or near edges of an upper surface of the PCB 300 (e.g., a surface of the PCB 300 that faces the image sensor chip 100). The bonding pads 310 may be formed of a conductive material (e.g., copper). Each of the plurality of chip pads 120 of the image sensor chip 100 may be connected to a corresponding one of the plurality of bonding pads 310 of the PCB 300 using a conductive wire 130. The image sensor chip 100 may be electrically connected to circuits on or in the PCB 300 through the conductive wires 130. In an implementation, a height of the conductive wire 130 along the Z-axis direction from a first surface of the image sensor chip 100 may be, e.g., 50 µm to 120 µm.

A plurality of bumps 330 may be on a lower surface of the PCB 300 (e.g., on a surface of the PCB 300 that faces away from the image sensor chip 100).

In an implementation, as shown in FIG. 2, a ratio of a total length X1 of the image sensor chip 100 in the X-axis direction to a length X2 of only the APS region 110 in the X-axis direction may be, e.g., 1:0.854 to 1:0.874. In an implementation, a ratio of a total width Y1 of the image sensor chip 100 in the Y-axis direction to a width Y2 of only the APS region 110 in the Y-axis direction may be, e.g. 1:0.808 to 1:0.828.

A total length of the non-sensing region in the X-axis direction may be obtained by subtracting the length X2 of the APS region 110 in the X-axis direction from the total length X1 of the image sensor chip 100 in the X-axis direction. The non-sensing region may be on each of left and right sides of the APS region 110 in the X-axis direction. Lengths X3 of the non-sensing regions (on the left and right sides of the APS region 110) in the X-axis direction may be the same. The length X3 of each non-sensing region on the left and right sides of the APS region 110 in the X-axis direction may be obtained by dividing the total length of the non-sensing region in the X-axis direction by two. In an implementation, a ratio of the total length X1 of the image sensor chip 100 in the X-axis direction to the length X3 of one non-sensing region in the X-axis direction may be, e.g., 1:0.063 to 1:0.073.

A total width of the non-sensing region in the Y-axis direction may be obtained by subtracting the width Y2 of the APS region 110 in the Y-axis direction from the total width Y1 of the image sensor chip 100 in the Y-axis direction. The non-sensing region may be on each of upper and lower sides of the APS region 110 in the Y-axis direction (e.g., in the orientation illustrated in FIG. 2). Widths Y3 of each non-sensing regions (on the upper and lower sides of the APS region 110) in the Y-axis direction may be the same. The width Y3 of each non-sensing region on the upper and lower sides of the APS region 110 in the Y-axis direction may be obtained by dividing the total width of the non-sensing region in the Y-axis direction by two. In an implementation, a ratio of the total width Y1 of the image sensor chip 100 in the Y-axis direction to the width Y3 of one non-sensing region in the Y-axis direction may be, e.g., 1:0.086 to 1:0.096.

In an implementation, the total length X1 of the image sensor chip 100 in the X-axis direction may be, e.g., 7.235 mm±0.08 mm, and the length X2 of only the APS region 110 in the X-axis direction may be, e.g., 6.252 mm±0.05 mm. In an implementation, the length X3 of one non-sensing region in the X-axis direction on the left or right side of the APS region 110 in the X-axis direction may be, e.g., 491.5 µm±5 µm. In an implementation, the total width Y1 of the image sensor chip 100 in the Y-axis direction may be, e.g., 4.958 mm±0.08 mm, and the width Y2 of only the APS region 110 in the Y-axis direction may be, e.g., 4.056 mm±0.05 mm. In an implementation, the width Y3 of one non-sensing region in the Y-axis direction on the upper or lower side of the APS region 110 in the Y-axis direction may be, e.g., 451 µm±5 µm.

In an implementation, the total length X1 of the image sensor chip 100 in the X-axis direction may be, e.g., 7.235 mm±0.08 mm, and the length X2 of only the APS region 110 in the X-axis direction may be, e.g., 6.375 mm±0.05 mm. In an implementation, the length X3 of one non-sensing region in the X-axis direction on the left or right side of the APS region 110 in the X-axis direction may be, e.g., 430 µm±5 µm. In an implementation, the total width Y1 of the image sensor chip 100 in the Y-axis direction may be, e.g., 4.958 mm±0.08 mm, and the width Y2 of only the APS region 110 in the Y-axis direction may be, e.g., 4.098 mm±0.05 mm. In an implementation, the width Y3 of one non-sensing region in the Y-axis direction on the upper or lower side of the APS region 110 in the Y-axis direction may be, e.g., 430 µm±5 µm.

In an implementation, the total length X1 of the image sensor chip 100 in the X-axis direction may be, e.g., 7.235 mm±0.08 mm, and the length X2 of only the APS region 110 in the X-axis direction may be, e.g., 6.535 mm±0.05 mm. In an implementation, the length X3 of on non-sensing region in the X-axis direction on the left or right side of 350 the APS region 110 in the X-axis direction may be, e.g., 350 µm±5 µm. In an implementation, the total width Y1 of the image sensor chip 100 in the Y-axis direction may be, e.g., 4.958 mm±0.08 mm, and the width Y2 of only the APS region 110 in the Y-axis direction may be, e.g., 4.258 mm±0.05 mm. In an implementation, the width Y3 of one non-sensing region in the Y-axis direction on the upper or lower side of the APS region 110 in the Y-axis direction may be, e.g., 350 µm±5 µm.

The bonding dam 200 may be in the non-sensing region, e.g., at the periphery of the APS region 110. The bonding dam 200 may be at the periphery of the APS region 110 at a predetermined or fixed interval from the APS region 110 (e.g., the bonding dam 200 may be spaced apart from the APS region 110. In an implementation, the bonding dam 200 may be spaced apart from an end or outer edge of the APS region 110 at an interval or distance of, e.g., 80 µm to 150 µm. In an implementation, the bonding dam 200 may be spaced part from an end of a side surface (e.g., an outer edge) of the image sensor chip 100 at an interval or distance of, e.g., 80 µm to 150 µm. The bonding dam 200 may a height (e.g., measured from a surface of the image sensor chip 100 along the Z-axis direction) of, e.g., 50 µm to 150 µm, and a width (e.g., in the X-axis direction or Y-axis direction) of, e.g., 160 µM to 240 µm.

In an implementation, the non-sensing region may have the length X3 of 491.5 µm in the X-axis direction and the width Y3 of 451 µm in the Y-axis direction, and the bonding dam 200 may have a height of 50 µm to 150 µm along the Z-axis direction and a width of 200 µm to 240 µm along the X-axis direction and/or the Y-axis direction. In an implementation, the non-sensing region may have the length X3 and width Y3 of 430 µm in the X-axis and Y-axis directions, and the bonding dam 200 may have a height of 50 µm to 150 µm and a width of 180 µm to 220 µm. In an implementation, the non-sensing region may have the length X3 and width Y3 of 350 µm in the X-axis and Y-axis directions, and the bonding dam 200 may have a height of 50 µm to 150 µm along the Z-axis direction and a width of 160 µm to 200 µm along the X-axis direction and/or the Y-axis direction.

The cover glass 400 may be on the bonding dam 200 so that the cover glass 400 may be bonded to or face an upper portion or surface of the image sensor chip 100. In an implementation, the bonding dam 200 may extend inwardly from an end of (e.g., may be spaced apart from, in an inward direction, relative to) the side surface of the image sensor chip 100 and/or the cover glass 400 to the APS region 110 by a distance of, e.g., 80 µm to 150 µm, to bond the cover glass 400.

An encapsulation layer 320 may cover the side surface of the cover glass 400, edges or ends of a lower surface of the cover glass 400, edges of the first or upper surface (e.g., a surface on which the chip pads 120 are formed) of the image sensor chip 100, the side surface of the image sensor chip 100, a side surface of the bonding dam 200, and the edges or ends of the upper surface of the PCB 300. The encapsulation layer 320 may be formed by applying glue, e.g., an epoxy molding compound (EMC). As described above, the image sensor chip 100 and the cover glass 400 may be bonded by the bonding dam 200 and the encapsulation layer 320.

Some bonding dams may have a width of 500 µm to 600 µm so that bonding strength between the image sensor chip and the cover glass may be secured. The width of the non-sensing region may decrease as a resolution of an image sensor increases, and thus the width of the bonding dam may also be reduced. In this case, even when the width of the bonding dam is reduced, bonding strength of the cover glass should be secured.

According to an embodiment, the bonding dam 200 may have a width e.g., 160 µm to 240 µm, and the bonding dam 200 may be inwardly spaced apart from the end of the side surface of (e.g., the outer edge of) the image sensor chip 100 and/or the cover glass 400 by a distance of, e.g., 80 µm to 150 µm. For example, the bonding dam 200 may not be on the (e.g., outermost) edges of the upper surface of the image sensor chip 100 and the (e.g., outermost) edges of the lower surface of the cover glass 400. In this case, the (e.g., outermost) edges of the upper surface of the image sensor chip 100 and the (e.g., outermost) edges of the lower surface of the cover glass 400 may remain as an empty space (e.g., may not be covered or contacted by the bonding dam 200). In an implementation, the encapsulation layer 320 may fill the space between the edges of the upper surface of the image sensor chip 100 and the edges of the lower surface of the cover glass 400. For example, the encapsulation layer 320 may cover the edges of the upper surface of the image sensor chip 100 and the edges of the lower surface of the cover glass 400, which are not in contact with the bonding dam 200. In addition, the encapsulation layer 320 may be in contact with the side surface of the bonding dam 200. As described above, the cover glass 400 may be primarily bonded using the bonding dam 200, and the cover glass 400 may be secondarily bonded using the encapsulation layer 320. For example, a sufficient area for bonding the cover glass 400 and the bonding strength of the cover glass 400 may be secured.

Figure 4:
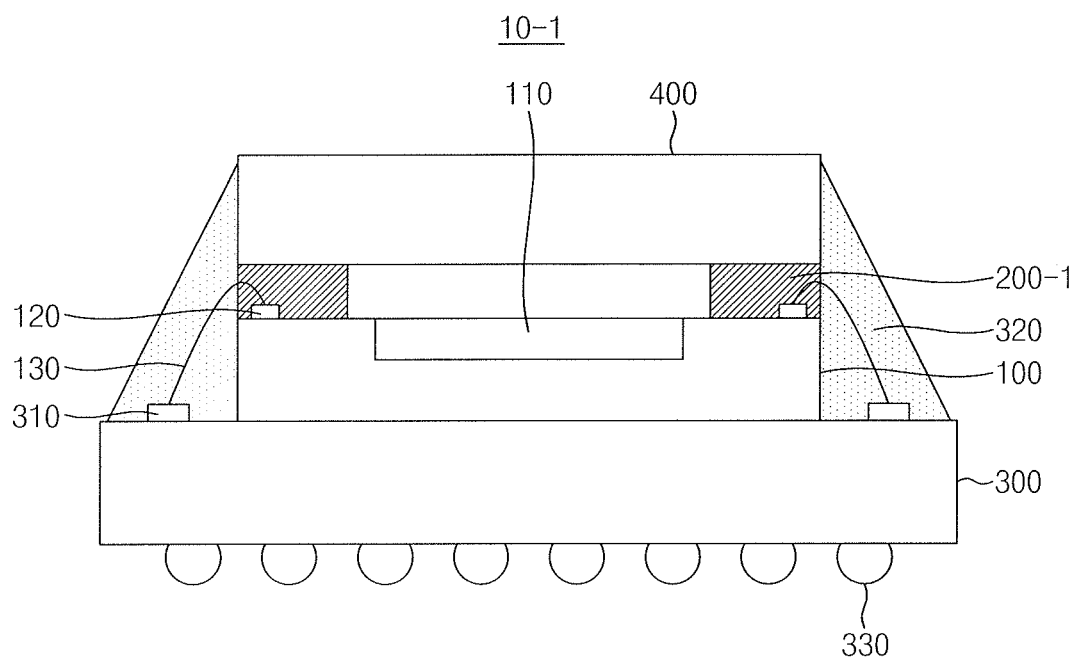
FIG. 4 illustrates a cross-sectional view of an image sensor package according to an example embodiment.
Figure 5:
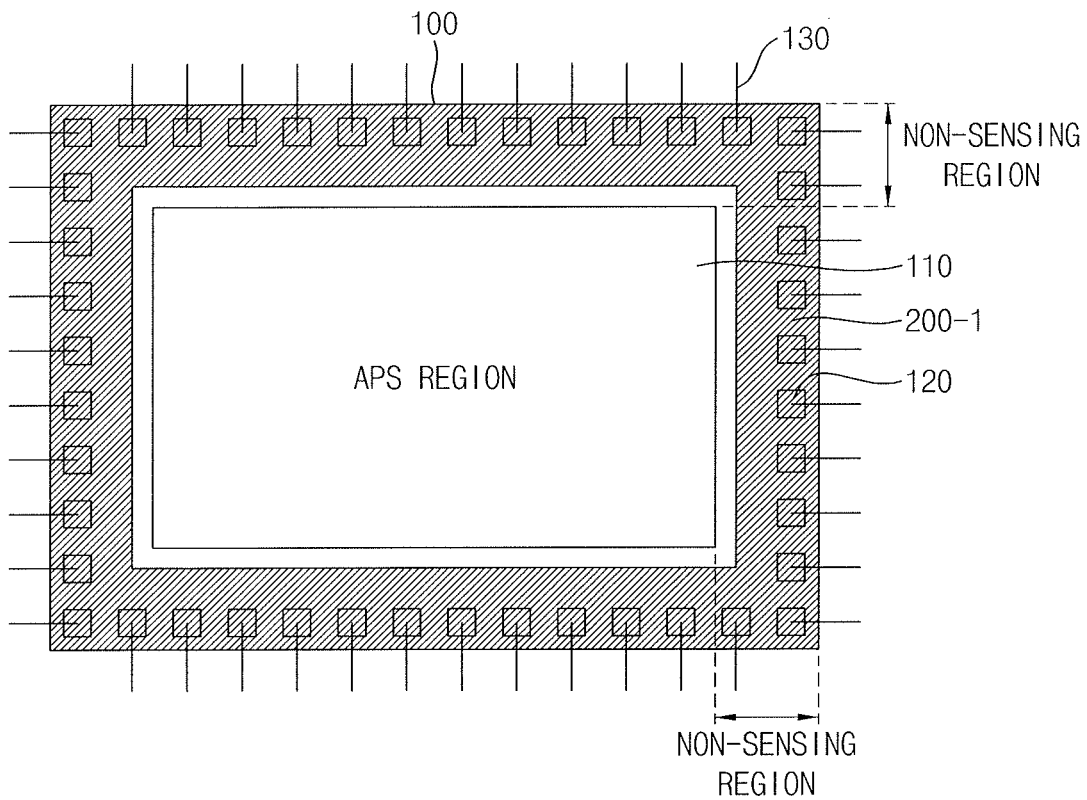
FIG. 5 illustrates a view of a bonding dam formed to cover pads.

FIG. 4 illustrates a cross-sectional view of an image sensor package 10-1 according to an example embodiment. FIG. 5 illustrates a view showing a bonding dam 200-1 covering pads. In description of the image sensor package 10-1 shown in FIGS. 4 and 5, repeated descriptions of the same configuration as the image sensor package 10 shown in FIGS. 1 to 3 may be omitted.

Referring to FIGS. 4 and 5, the image sensor package 10-1 according to the present embodiment may include the image sensor chip 100, a bonding dam 200-1, the PCB 300, and the cover glass 400.

The image sensor chip 100 may include the APS region 110 and the non-sensing region. The non-sensing region may be at a periphery of the APS region 110 and the plurality of chip pads 120 may be in the non-sensing region.

In an implementation, the image sensor chip 100 and the cover glass 400 may have the same dimensions (e.g., length and width) in X-axis and Y-axis directions relative to one another. In an implementation, the cover glass 400 may have a length and/or width that is greater than that of the image sensor chip 100 in the X-axis and Y-axis directions.

The bonding dam 200-1 may be between the image sensor chip 100 and the cover glass 400 to bond the image sensor chip 100 to the cover glass 400.

The bonding dam 200-1 may surround the APS region 110 and may be at a predetermined interval from the (e.g., outer edge or side of) APS region 110. The bonding dam 200-1 may cover the plurality of chip pads 120. The cover glass 400 may be on the bonding dam 200 so that the cover glass 400 may be bonded onto the image sensor chip 100. In a manufacturing process, the plurality of chip pads 120 and a plurality of bonding pads 310 may be connected to each other through conductive wires 130, and then the bonding dam 200-1 may be formed to cover the plurality of chip pads 120.

The encapsulation layer 320 may cover side surfaces of the cover glass 400, side surfaces of the bonding dam 200-1, side surfaces of the image sensor chip 100, and edge portions of an upper surface of the PCB 300.

In an implementation, a total length of the image sensor chip 100 in the X-axis direction may be, e.g., 7.235 mm±0.08 mm, and a length of only the APS region 110 in the X-axis direction of may be, e.g., 6.375 mm to 6.535 mm±0.05 mm (6.325 mm to 6.585 mm). In an implementation, a length of one non-sensing region in the X-axis direction on left or right sides of the APS region 110 in the X-axis direction may be, e.g., 350 μm to 430 μm±5 μm (345 μm to 435 μm). In an implementation, a total width of the image sensor chip 100 in the Y-axis direction may be, e.g., 4.958 mm±0.08 mm, and a width of only the APS region 110 in the Y-axis direction may be, e.g., 4.098 mm to 4.258 mm±0.05 mm (4.048 mm to 4.308 mm). In an implementation, a width of one non-sensing region in the Y-axis direction on upper or lower sides of the APS region 110 in the Y-axis direction may be, e.g., 350 μm to 430 μm±5 μm (345 μm to 435 μm). In an implementation, a distance from an end of the APS region 110 to an end of the non-sensing region may be, e.g., 350 μm to 430 μm±5 μm (345 μm to 435 μm).

In an implementation, the bonding dam 200-1 may be spaced, e.g., 80 μM to 150 μm, from the end (e.g., outer edge) of the APS region 110 to the end of the non-sensing region (e.g., to be aligned with an outer side or edge of the image sensor chip 100). In an implementation, a height of the bonding dam 200-1 may be, e.g., 50 μm to 150 μm along the Z-axis direction, and a width of the bonding dam 200-1 may be, e.g., 200 μm to 350 μm along the X-axis direction and/or the Y-axis direction.

The cover glass 400 may be primarily bonded using the bonding dam 200-1 (having a width of, e.g., 200 μm to 350 μm), and the cover glass 400 may be secondarily bonded using the encapsulation layer 320. As described above, the cover glass 400 may be bonded using the bonding dam 200 and the encapsulation layer 320 to help secure a sufficient area for bonding the cover glass 400 and bonding strength of the cover glass 400.

Figure 6:
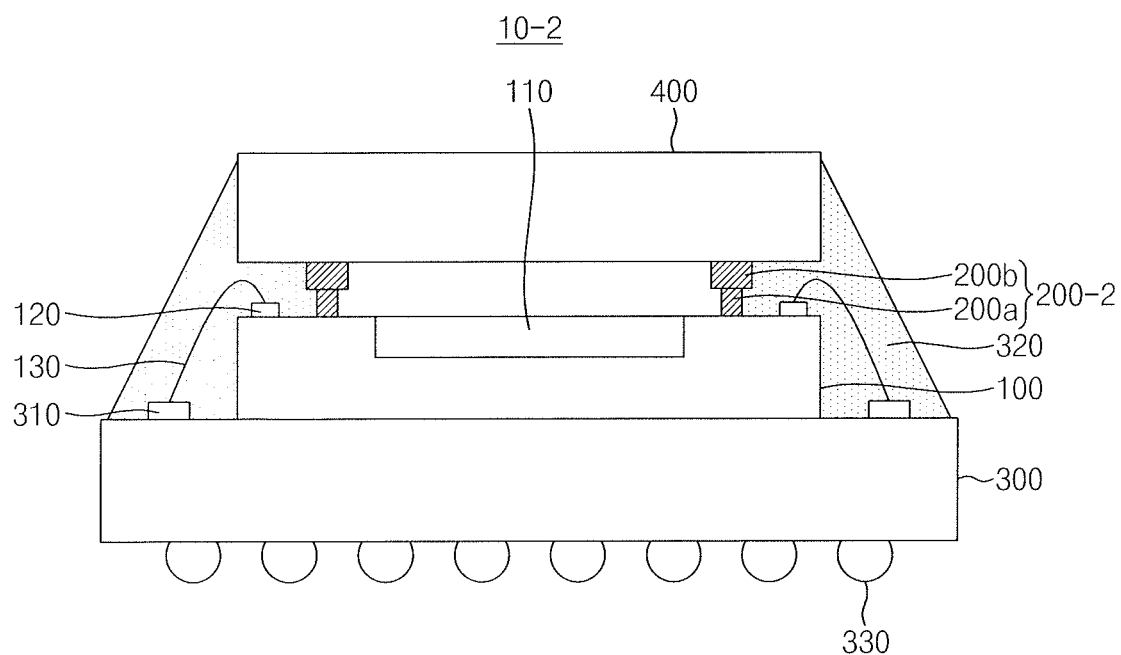
FIG. 6 illustrates a cross-sectional view of an image sensor package according to an example embodiment.

FIG. 6 is a cross-sectional view of an image sensor package 10-2 according to an example embodiment. In the description of the image sensor package 10-2 shown in FIG. 6, repeated descriptions of the same configuration as the image sensor package 10 shown in FIGS. 1 to 3 may be omitted.

Referring to FIG. 6, the image sensor package 10-2 according to the example embodiment may include the image sensor chip 100, a bonding dam 200-2, the PCB 300, and the cover glass 400.

The image sensor chip 100 may include the APS region 110 and the non-sensing region. The non-sensing region may be at a periphery of the APS region 110, and the plurality of chip pads 120 may be in the non-sensing region.

The bonding dam 200-2 may be between the image sensor chip 100 and the cover glass 400 along the Z-axis direction, and may have a height of 50 μm to 150 μm to bond the image sensor chip 100 to the cover glass 400. The bonding dam 200-2 may surround the APS region 110 at a predetermined interval from the APS region 110.

In an implementation, the bonding dam 200-2 may include, e.g., a first bonding dam 200a and a second bonding dam 200b. The first bonding dam 200a may be on a first surface (e.g., a surface on which the chip pads 120 are formed) of the image sensor chip 100 and may have a first width. The second bonding dam 200b may be on a lower surface of the cover glass 400 and may have a second width. The first bonding dam 200a and the second bonding dam 200b may have different widths and may overlap each other in a vertical direction (e.g., the first bonding dam 200a may be between the image sensor chip 100 and the second bonding dam 200b). The first bonding dam 200a may have a first width and the second bonding dam 200b may have a second width that is greater than the first width. In a manufacturing process, the first bonding dam 200a may be formed to have the first width such that glue for forming the second bonding dam 200b does not enter the APS region 110. The second bonding dam 200b (in contact with the lower surface of the cover glass 400) may be formed to have the second width that is greater than the first width such that the second bonding dam 200b may be smoothly adhered to the first bonding dam 200a.

In an implementation, the total length of the image sensor chip 100 in an X-axis direction may be, e.g., 7.235 mm±0.08 mm, and a length of only the APS region 110 in the X-axis direction may be, e.g., 6.375 mm to 6.535 mm±0.05 mm (6.325 mm to 6.585 mm). In an implementation, the length of one non-sensing region in the X-axis direction on left or right sides of the APS region 110 in the X-axis direction may be, e.g., 350 μm to 430 μm±5 μm (345 μm to 435 μm). In an implementation, the total width of the image sensor chip 100 in a Y-axis direction may be, e.g., 4.958 mm±0.08 mm, and a width of only the APS region 110 in the Y-axis direction may be, e.g., 4.098 mm to 4.258 mm±0.05 mm (4.048 mm to 4.308 mm). In an implementation, the width of one non-sensing region in the Y-axis direction on of upper or lower sides of the APS region 110 in the Y-axis direction may be, e.g., 350 μm to 430 μm±5 μm (345 μm to 435 μm). In an implementation, a distance from an end of the APS region 110 to an end of the non-sensing region may be, e.g., 350 μm to 430 μm±5 μm (345 μm to 435 μm). In an implementation, the bonding dam 200-2 may be formed at an interval or distance of, e.g., 80 μm to 150 μm, from the end of the APS region 110. In an implementation, the bonding dam 200-2 may be at an interval or distance of, e.g., 80 μm to 150 μm, from an end of a side surface of the image sensor chip 100. In an implementation, the first bonding dam 200a may have a width of, e.g., 160 μm to 220 μm along the X-axis direction and/or the Y-axis direction. In an implementation, the second bonding dam 200b may have a width of, e.g., 220 μm to 280 μm along the X-axis direction and/or the Y-axis direction.

The encapsulation layer 320 may cover side surfaces of the cover glass 400, edges of the lower surface of the cover glass 400, side surfaces of the bonding dam 200-2, the non-sensing region of the image sensor chip 100, and edge portions of an upper surface of the PCB 300. For example, the encapsulation layer 320 may fill a space between edges of an upper surface of the image sensor chip 100 and the edges of the lower surface of the cover glass 400. For example, the encapsulation layer 320 may cover the edges of the upper surface of the image sensor chip 100 and the edge of the lower surface of the cover glass 400, which are not in contact with the bonding dam 200-2.

The cover glass 400 may be primarily bonded using the bonding dam 200-2 (which includes the first bonding dam 200a and the second bonding dam 200b), and the cover glass 400 may be secondarily bonded using the encapsulation layer 320. As described above, the cover glass 400 may be bonded using the bonding dam 200-2 and the encapsulation layer 320 to help secure a sufficient area for bonding the cover glass 400 and bonding strength of the cover glass 400.

Figure 7A:
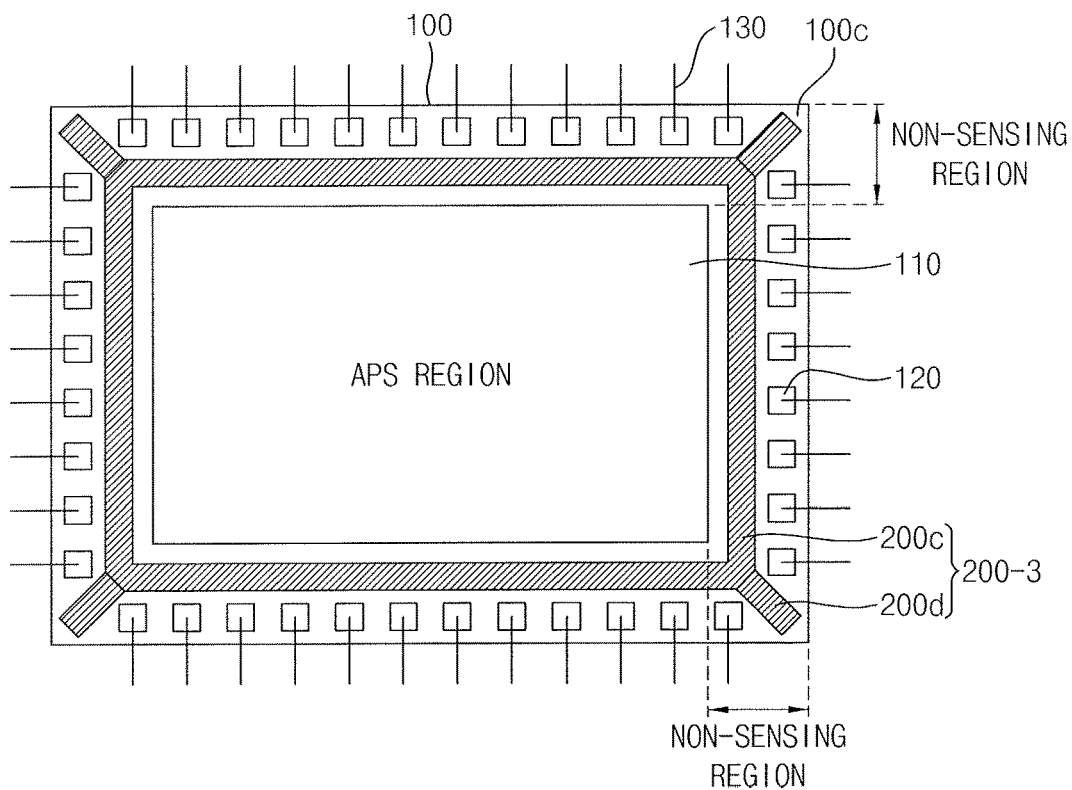
FIG. 7A illustrates a plan view of a bonding dam formed in a region in which pads are not formed.

FIG. 7A illustrates a plan view of a bonding dam 200-3 formed in a region in which pads are not formed. In the description of an image sensor package shown in FIG. 7A, repeated descriptions of the same configuration as the image sensor package 10 shown in FIGS. 1 to 3 may be omitted.

Referring to FIG. 7A, the image sensor chip 100 may include the APS region 110 and the non-sensing region. The non-sensing region may be at a periphery of the APS region 110, and the plurality of chip pads 120 may be in the non-sensing region.

The bonding dam 200-3 may be in or on the non-sensing region. The bonding dam 200-3 may include a third bonding dam 200c and a fourth bonding dam 200d. The third bonding dam 200c and the fourth bonding dam 200d may have a width of, e.g., 160 μm to 240 μm. For example, the third bonding dam 200c may extend around the periphery of the APS region 110 and may have a width of, e.g., 160 μm to 240 μm, along both the X-axis direction and the Y-axis direction, and the fourth bonding dam 200d may extend from corners of the third bonding dam 200c and may have a width of, e.g., 160 μm to 240 μm, along a direction diagonal to the X-axis direction or the Y-axis direction. The bonding dam 200-3 may be between the image sensor chip 100 and a cover glass, and may have a height of, e.g., 50 μm to 150 μm along the Z-axis direction, to bond the image sensor chip 100 to the cover glass. In an implementation, the total length of the image sensor chip 100 in an X-axis direction may be, e.g., 7.235 mm±0.08 mm, and a length of only the APS region 110 in the X-axis direction may be, e.g., 6.375 mm to 6.535 mm±0.05 mm (6.325 mm to 6.585 mm). In an implementation, the length of on non-sensing region in the X-axis direction on of left or right sides of the APS region 110 in the X-axis direction may be, e.g., 350 μm to 430 μm±5 μm (345 μm to 435 μm). In an implementation, the total width of the image sensor chip 100 in a Y-axis direction may be, e.g., 4.958 mm±0.08 mm, and a width of only the APS region 110 in the Y-axis direction may be, e.g., 4.098 mm to 4.258 mm±0.05 mm (4.048 mm to 4.308 mm). In an implementation, the width of one non-sensing region in the Y-axis direction on upper or lower sides of the APS region 110 in the Y-axis direction may be, e.g., 350 μm to 430 μm±5 μm (345 μm to 435 μm). In an implementation, a distance from an end of the APS region 110 to an end of the non-sensing region may be, e.g., 350 μm to 430 μm±5 (345 μm to 435 μm).

The third bonding dam 200c may surround the APS region 110 at an interval or distance of, e.g., 80 μm to 150 μm, from the APS region 110. In order to increase an area for bonding to the cover glass, the fourth bonding dam 200d may be in a region of the non-display region in which the chip pads 120 are not formed.

For example, the fourth bonding dam 200d may be on a corner portion 110c of a first or upper surface of the image sensor chip 100. In an implementation, the third bonding dam 200c and the fourth bonding dam 200d may be connected to each other, e.g., may be integral as a monolithic structure. In an implementation, the third bonding dam 200c and the fourth bonding dam 200d may be spaced apart from each other.

An encapsulation layer 320 may cover side surfaces of the cover glass, side surfaces of the image sensor chip 100, side surfaces of the third bonding dam 200c, side surfaces of the fourth bonding dam 200d, and edge portions of an upper surface of the PCB 300. The encapsulation layer 320 may fill a space between edges of an upper surface of the image sensor chip 100 and edges of a lower surface of the cover glass.

The cover glass may be primarily bonded using the third bonding dam 200c of the non-sensing region, and the cover glass may be secondarily bonded using the fourth bonding dam 200d of the non-sensing region. In addition, the cover glass may be tertiarily bonded using the encapsulation layer 320. As described above, the cover glass may be bonded using the bonding dam 200-3 and the encapsulation layer 320 to help secure a sufficient area for bonding the cover glass and bonding strength of the cover glass.

Figure 7B:
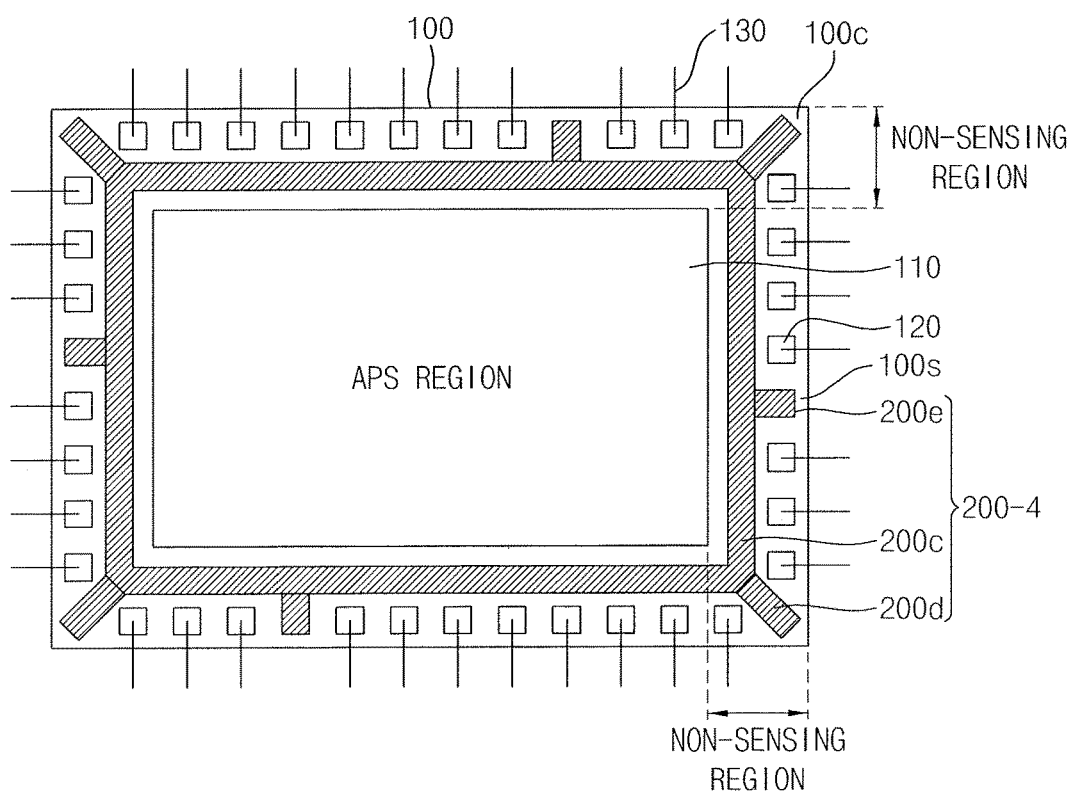
FIG. 7B illustrates a plan view of a bonding dam formed in a region in which pads are not formed.

FIG. 7B illustrates a plan view of a bonding dam formed in a region in which pads are not formed. In the description of an image sensor package shown in FIG. 7B, repeated descriptions of the same configuration as the image sensor package 10 shown in FIGS. 1 to 3 may be omitted.

Referring to FIG. 7B, the image sensor chip 100 may include the APS region 110 and the non-sensing region. The non-sensing region may be at a periphery of the APS region 110, and the plurality of chip pads 120 may be in or on the non-sensing region. In an implementation, a distance from an end of the APS region 110 to an end of the non-sensing region may be, e.g., 350 μm to 430 μm±5 μm (345 μm to 435 μm).

In an implementation, a bonding dam 200-4 may include, e.g., the third bonding dam 200c, the fourth bonding dam 200d, and a fifth bonding dam 200e. The third bonding dam 200c, the fourth bonding dam 200d, and the fifth bonding dam 200e may each have a width of, e.g., 160 μm to 240 μm. For example, the fifth bonding dam 200e may extend along the X-axis direction or the Y-axis direction from the third bonding dam 200c. When extending along the X-axis direction, the fifth bonding dam 200e may have the width along the Y-axis direction and vice versa. The bonding dam 200-4 may be between the image sensor chip 100 and a cover glass 400, and may have a height of, e.g., 50 μm to 150 μm, to bond the image sensor chip 100 to the cover glass 400.

The third bonding dam 200c may surround the APS region 110 at an interval or distance of, e.g., 80 μm to 150 μm, from the APS region 110. In order to increase an area for bonding to the image sensor chip 100 and the cover glass 400, the fourth bonding dam 200d and the fifth bonding dam 200e may be included in a region in which the chip pads 120 are not formed. For example, the fifth bonding dam 200e may extend from a lateral portion of the third bonding dam 200c along the X-axis direction.

For example, the fourth bonding dam 200d may be on a corner portion 110c of a first surface of the image sensor chip 100. For example, the fifth bonding dam 200e may be on at least one side 100s of four sides 100s of the first surface of the image sensor chip 100. In an implementation, the third bonding dam 200c and the fourth bonding dam 200d may be connected to each other. In an implementation, the third bonding dam 200c and the fourth bonding dam 200d may be spaced apart from each other. In an implementation, the third bonding dam 200c and the fifth bonding dam 200e may be connected to each other. In an implementation, the third bonding dam 200c and the fifth bonding dam 200e may be spaced apart from each other.

An encapsulation layer 320 may cover side surfaces of the cover glass 400, side surfaces of the image sensor chip 100, side surfaces of the third bonding dam 200c, side surfaces of the fourth bonding dam 200d, side surfaces of the fifth bonding dam 200e, and edge portions of an upper surface of a PCB 300. The encapsulation layer 320 may fill a space between edges of an upper surface of the image sensor chip 100 and edges of a lower surface of the cover glass 400.

The cover glass 400 may be primarily bonded using the third bonding dam 200c of the non-sensing region, the cover glass 400 may be secondarily bonded using the fourth bonding dam 200*d* on the corner portion 110*c* of the non-sensing region, and the cover glass 400 may be tertiarily bonded using the fifth bonding dam 200*e* on the side 100*s* of the non-sensing region. In addition, the cover glass 400 may be quaternary bonded using the encapsulation layer 320. As described above, the cover glass 400 may be bonded using the bonding dam 200-4 and the encapsulation layer 320 to help secure a sufficient area for bonding the cover glass 400.

Figure 8:
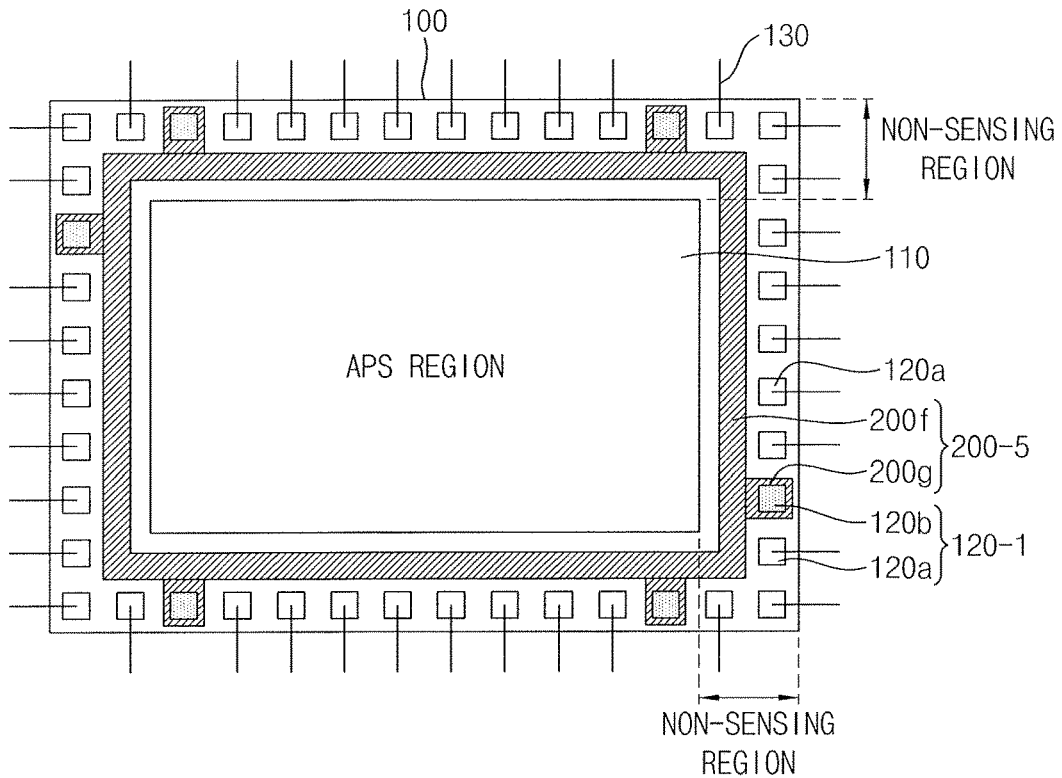
FIG. 8 illustrates a view of a bonding dam formed to cover dummy pads.

FIG. 8 illustrates a view of a bonding dam 200-5 formed to cover dummy pads 120*b*. In the description of an image sensor package shown in FIG. 8, repeated descriptions of the same configuration as the image sensor package 10 shown in FIGS. 1 to 3 may be omitted.

Referring to FIG. 8, the image sensor chip 100 may include the APS region 110 and the non-sensing region. The non-sensing region may be at a periphery of the APS region 110, and the plurality of chip pads 120 may be in or on the non-sensing region. In an implementation, a distance from an end of the APS region 110 to an end of the non-sensing region may be, e.g., 350 µm to 430 µm±5 µm (345 µm to 435 µm).

The bonding dam 200-5 may include, e.g., a sixth bonding dam 200*f* and a seventh bonding dam 200*g*. The sixth bonding dam 200*f* and the seventh bonding dam 200*g* may each have a width of, e.g., 160 µm to 240 µm. The sixth bonding dam 200*f* may be between the image sensor chip 100 and the cover glass 400, and may have a height ranging from 50 µm to 150 µm along the Z-axis direction. The sixth bonding dam 200*f* may surround the APS region 110 at an interval or distance of, e.g., 80 µm to 150, µm from the APS region 110.

A plurality of chip pads 120-1 in the non-sensing region may include active pads 120*a* (which are actually used) and the dummy pads 120*b* (which are not used). In order to increase an area for bonding to the cover glass 400, the seventh bonding dam 200*g* may cover the dummy pad 120*b* among the plurality of chip pads 120-1 in the non-sensing region. In an implementation, the sixth bonding dam 200*f* and the seventh bonding dam 200*g* may be connected to each other. In an implementation, the sixth bonding dam 200*f* and the seventh bonding dam 200*g* may be spaced apart from each other.

An encapsulation layer 320 may cover side surfaces of the cover glass 400, side surfaces of the image sensor chip 100, side surfaces of the sixth bonding dam 200*f*, side surfaces of the seventh bonding dam 200*g*, and edge portions of an upper surface of a PCB 300. The encapsulation layer 320 may fill a space between edges of an upper surface of the image sensor chip 100 and edges of a lower surface of the cover glass 400.

The cover glass 400 may be primarily bonded using the sixth bonding dam 200*f* on the non-sensing region, and the cover glass 400 may be secondarily bonded using the seventh bonding dam 200*g* covering the dummy pads 120*b*. In addition, the cover glass 400 may be tertiarily bonded using the encapsulation layer 320. As described above, the cover glass 400 may be bonded using the bonding dam 200-5 and the encapsulation layer 320 to help secure a sufficient area for bonding the cover glass 400 and bonding strength of the cover glass 400.

Figure 9A:
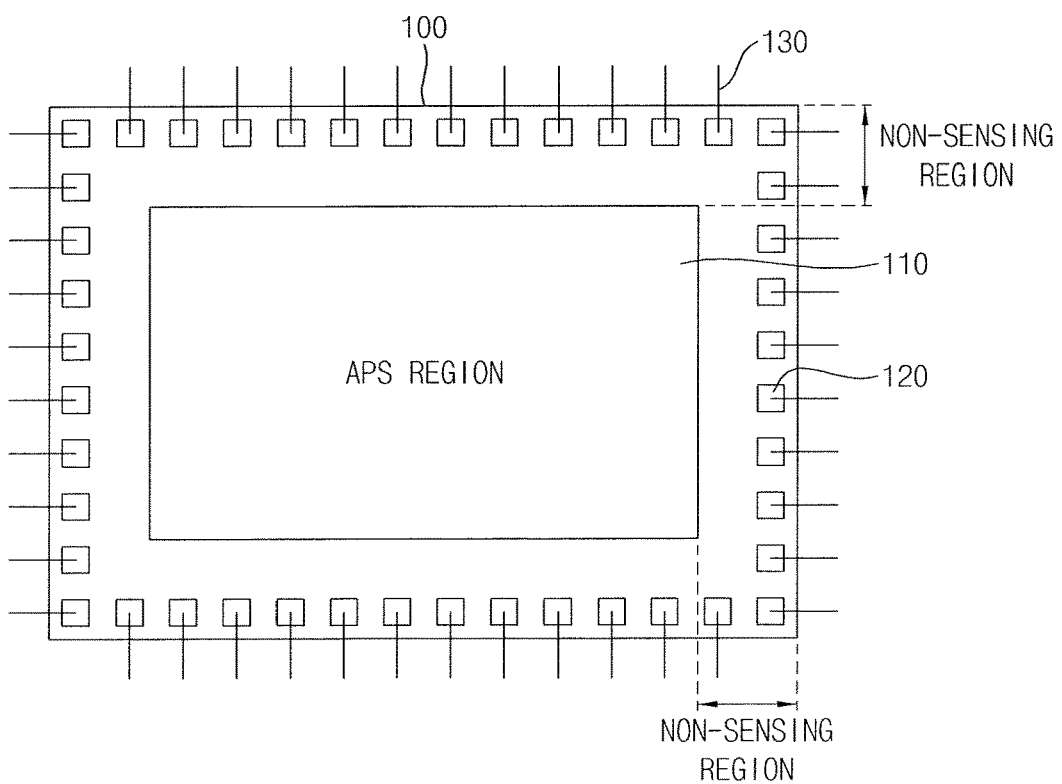
FIGS. 9A to 9C illustrate views of stages in a method of manufacturing an image sensor package according to an example embodiment.
Figure 9B:
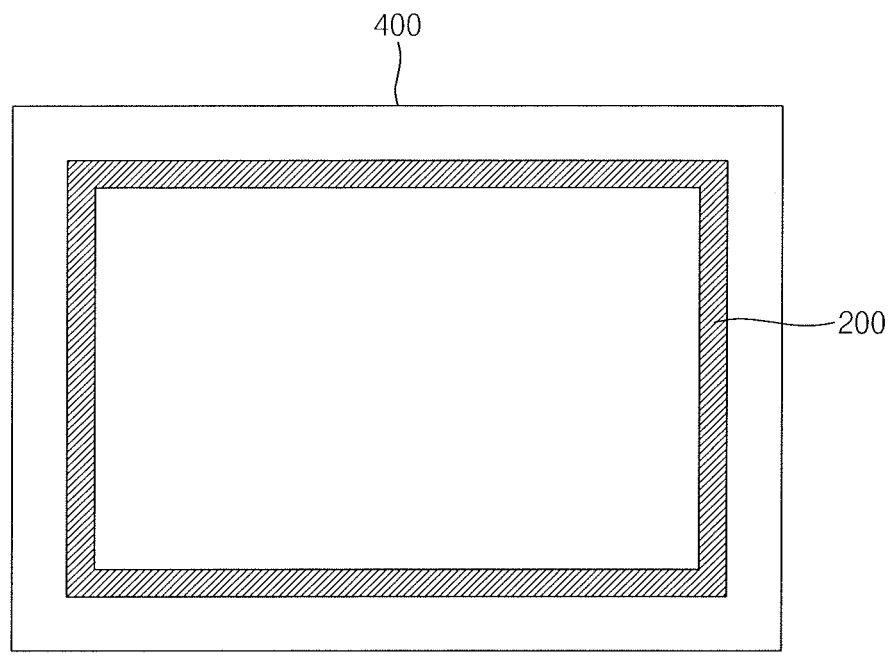
Figure 9C:
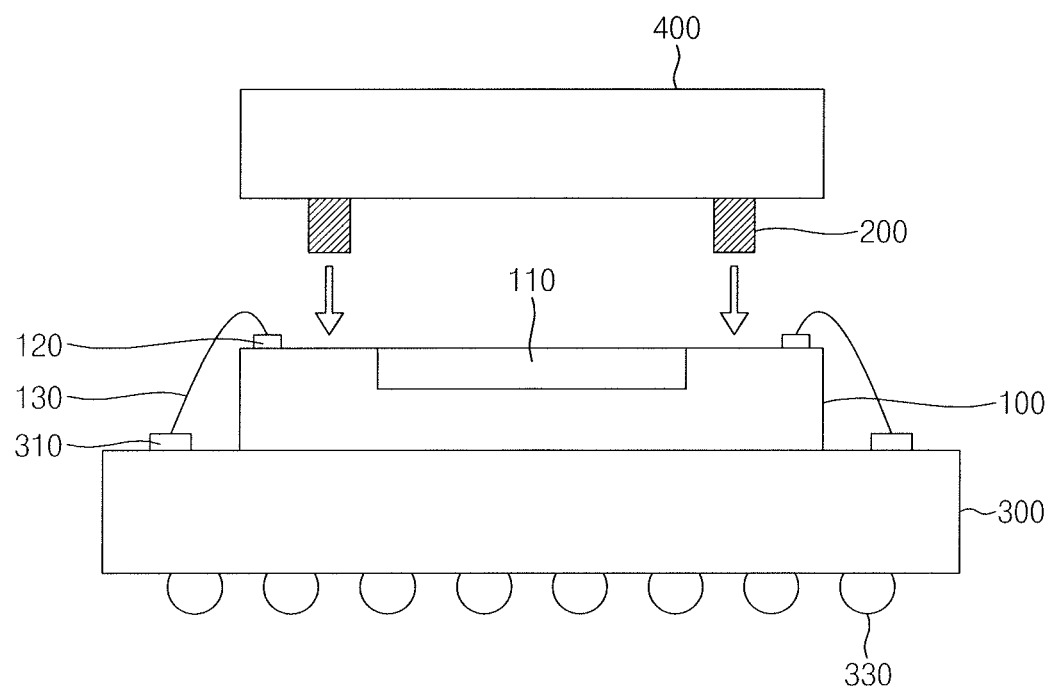

FIGS. 9A to 9C illustrate views showing stages in a method of manufacturing an image sensor package according to an example embodiment.

Referring to FIG. 9A, the APS region 110 may be formed on the first surface of the image sensor chip 100, and the plurality of chip pads 120 may be formed in the non-sensing region at a periphery of the APS region 110. In an implementation, a distance from an end of the APS region 110 to an end of the non-sensing region may be, e.g., 350 µm to 430 µm.

Referring to FIGS. 9A and 9B, glue (e.g., an EMC) may be applied to edges of a lower surface of a cover glass 400 so that a bonding dam 200 may be formed. The bonding dam 200 may be between the image sensor chip 100 and the cover glass 400, and may have a height of, e.g., 50 µm to 150 µm along the Z-axis direction. The bonding dam 200 may be at an interval or distance of, e.g., 80 µm to 150 µm, from the APS region 110. The bonding dam 200 may be at an interval or distance of, e.g., 80 µm to 150 µm, from an end of a side surface of the image sensor chip 100. The bonding dam 200 may be have a width of, e.g., 160 µm to 240 µm along the X-axis direction and/or the Y-axis direction.

Referring to FIG. 9C, the image sensor chip 100 and the cover glass 400 may be bonded using the bonding dam 200. For example, the bonding dam 200 may be formed to extend inwardly (e.g., inwardly spaced apart) from the ends of the side surfaces of the image sensor chip 100 and the cover glass 400 toward the APS region 110 by a distance of, e.g., 80 µm to 150 µm.

Next, as shown in FIG. 1, glue (e.g., an EMC) may be applied to the side surfaces of the cover glass 400, side surfaces of the bonding dam 200, the non-sensing region of the image sensor chip 100, the side surfaces of the image sensor chip 100, and edges of an upper surface of the PCB 300 so that an encapsulation layer 320 may be formed.

The encapsulation layer 320 may fill a space between edges of an upper surface of the image sensor chip 100 and edges of a lower surface of the cover glass 400, which are not in contact with the bonding dam 200. As described above, the cover glass 400 may be primarily bonded using the bonding dam 200, and the cover glass 400 may be secondarily bonded using the encapsulation layer 320 to help secure a sufficient area for bonding the cover glass 400 and bonding strength of the cover glass 400.

By way of summation and review, when an area of a non-sensing region is reduced, a width of a bonding dam for bonding a cover glass may also be reduced. If the width of a bonding dam were to be reduced, bonding strength of the cover glass could also be reduced, and mechanical reliability could be affected. If the width of the bonding dam were to not be reduced, glue applied when the bonding dam is formed could enter an active pixel sensor (APS) region of a sensor chip, and defects could occur.

One or more embodiments may provide an image sensor package in which bonding strength of a cover glass is secured while reducing a size of a package.

According to the example embodiments, it is possible to reduce a size of a semiconductor package and secure bonding strength of a cover glass.

According to the example embodiments, a bonding dam may cover a non-sensing region to secure a sufficient area for bonding a cover glass.

According to the example embodiments, a cover glass may be bonded using a bonding dam and an encapsulation layer to secure a sufficient area for bonding the cover glass.

According to the example embodiments, a cover glass may be primarily bonded using a first bonding dam in a non-sensing region, and the cover glass may be secondarily bonded using a second bonding dam on a corner portion of the non-sensing region. As a result, a sufficient area for bonding the cover glass can be secured.

According to the example embodiments, a cover glass may be primarily bonded using a first bonding dam in the non-sensing region, the cover glass may be secondarily bonded using a second bonding dam on a corner portion of the non-sensing region, and the cover glass may be tertiarily bonded using a third bonding dam on a side of the non-sensing region. As a result, a sufficient area for bonding the cover glass can be secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor package, comprising:
an image sensor chip including an active pixel sensor region and a non-sensing region, a plurality of chip pads being in the non-sensing region;
a printed circuit board on one side of the image sensor chip, the printed circuit board including a plurality of bonding pads;
conductive wires respectively connecting the plurality of chip pads to the plurality of bonding pads;
a bonding dam at a periphery of the active pixel sensor region;
a cover glass on the bonding dam and facing another side of the image sensor chip; and
an encapsulation layer covering a side surface of the bonding dam, a side surface of the cover glass, an edge of a lower surface of the cover glass, the non-sensing region, and an edge of an upper surface of the printed circuit board,
wherein the bonding dam:
directly contacts the image sensor chip and directly contacts the cover glass,
is spaced apart from an end of a side surface of the image sensor chip by a distance of 80 µm to 150 µm,
has a height of 50 µm to 150 µm from the image sensor chip, and
has a width of 160 µm to 240 µm, and
wherein the bonding dam includes:
a first bonding dam including first and second lateral portions extending along an X-axis direction, third and fourth lateral portions extending along a Y-axis direction, a first corner portion connecting the first and third lateral portions, a second corner portion connecting the first and fourth lateral portions, a third corner portion connecting the second and third lateral portions, and a fourth corner portion connecting the second and fourth lateral portions,
a second bonding dam extending from the first corner portion,
a third bonding dam extending from the second corner portion, and
a fourth bonding dam extending from the first lateral portion, overlapping with the second and third bonding dams in the X-axis direction, spaced apart from the second and third bonding dams in the X-axis direction, and disposed between the second and third bonding dams.

2. The image sensor package as claimed in claim 1, wherein the encapsulation layer fills a space between an edge of an upper surface of the image sensor chip and the edge of the lower surface of the cover glass.

3. The image sensor package as claimed in claim 2, wherein:
a length of the image sensor chip in the X-axis direction is 7.155 mm to 7.315 mm;
a length of the active pixel sensor region in the X-axis direction is 6.325 mm to 6.585 mm;
a width of the image sensor chip in the Y-axis direction is 4.878 mm to 5.038 mm, the Y-axis direction being perpendicular to the X-axis direction; and
a width of the active pixel sensor region in the Y-axis direction is 4.048 mm to 4.308 mm.

4. The image sensor package as claimed in claim 3, wherein the non-sensing region has a length in the X-axis direction of 345 µm to 435 µm and a width in the Y-axis direction of 345 µm to 435 µm.

5. The image sensor package as claimed in claim 3, wherein the bonding dam is spaced apart from the active pixel sensor region in the X-axis direction or the Y-axis direction by a distance of 80 µm to 150 µm.

6. An image sensor package, comprising:
an image sensor chip including an active pixel sensor region and a non-sensing region, a plurality of chip pads being in the non-sensing region;
a printed circuit board on one side of the image sensor chip, the printed circuit board including a plurality of bonding pads;
conductive wires respectively connecting the plurality of chip pads to the plurality of bonding pads;
a bonding dam at a periphery of the active pixel sensor region and covering one or more of the plurality of chip pads;
a cover glass on the bonding dam and facing another side of the image sensor chip; and
an encapsulation layer covering a side surface of the bonding dam, a side surface of the cover glass, and an edge of an upper surface of the printed circuit board,
wherein the non-sensing region has a width of 345 µm to 435 µm,
wherein the bonding dam directly contacts the image sensor chip and directly contacts the cover glass, and
wherein the bonding dam includes:
a first bonding dam including first and second lateral portions extending along an X-axis direction, third and fourth lateral portions extending along a Y-axis direction, a first corner portion connecting the first and third lateral portions, a second corner portion connecting the first and fourth lateral portions, a third corner portion connecting the second and third lateral portions, and a fourth corner portion connecting the second and fourth lateral portions,
a second bonding dam extending from the first corner portion,
a third bonding dam extending from the second corner portion, and
a fourth bonding dam extending from the first lateral portion, overlapping with the second and third bonding dams in the X-axis direction, spaced apart from the second and third bonding dams in the X-axis direction, and disposed between the second and third bonding dams.

7. The image sensor package as claimed in claim 6, wherein:

a length of the image sensor chip in the X-axis direction is 7.155 mm to 7.315 mm;

a length of the active pixel sensor region in the X-axis direction is 6.325 mm to 6.585 mm;

a width of the image sensor chip in the Y-axis direction is 4.878 mm to 5.038 mm, the Y-axis direction being perpendicular to the X-axis direction; and a width of the active pixel sensor region in the Y-axis direction is 4.048 mm to 4.308 mm.

8. The image sensor package as claimed in claim 7, wherein the bonding dam has:

a height of 50 μm to 150 μm from the image sensor chip, and a width in the X-axis direction or Y-axis direction of 200 μm to 350 μm.

9. The image sensor package as claimed in claim 7, wherein the bonding dam:

is spaced apart from the active pixel sensor region in the X-axis direction or the Y-axis direction by a distance of 80 μm to 150 μm, and extends to be aligned with an end of the non-sensing region.

10. The image sensor package as claimed in claim 7, wherein:

the plurality of chip pads include a plurality of active pads and a plurality of dummy pads; and the bonding dam covers the plurality of dummy pads.

11. An image sensor package, comprising:

an image sensor chip including an active pixel sensor region and a non-sensing region, a plurality of chip pads being in the non-sensing region;

a printed circuit board on one side of the image sensor chip, the printed circuit board including a plurality of bonding pads;

conductive wires respectively connecting the plurality of chip pads to the plurality of bonding pads;

a first bonding dam at a periphery of the active pixel sensor region, the first bonding dam includes first and second lateral portions extending along an X-axis direction, third and fourth lateral portions extending along a Y-axis direction, a first corner portion connecting the first and third lateral portions, a second corner portion connecting the first and fourth lateral portions, a third corner portion connecting the second and third lateral portions, and a fourth corner portion connecting the second and fourth lateral portions;

a second bonding dam extending from the first corner portion;

a third bonding dam extending from the second corner portion;

a fourth bonding dam extending from the first lateral portion, overlapping with the second and third bonding dams in the X-axis direction, spaced apart from the second and third bonding dams in the X-axis direction, and disposed between the second and third bonding dams;

a cover glass on the first to fourth bonding dams, and facing another side of the image sensor chip; and an encapsulation layer covering side surfaces of the first to fourth bonding dams, a side surface of the cover glass, an edge of a lower surface of the cover glass, the non-sensing region, and an edge of an upper surface of the printed circuit board, wherein the first bonding dam directly contacts the image sensor chip and directly contacts the cover glass.

12. The image sensor package as claimed in claim 11, wherein the encapsulation layer fills a space between an edge of an upper surface of the image sensor chip and an edge of a lower surface of the cover glass.

13. The image sensor package as claimed in claim 12, wherein:

a length of the image sensor chip in the X-axis direction is 7.155 mm to 7.315 mm;

a length of the active pixel sensor region in the X-axis direction is 6.325 mm to 6.585 mm;

a width of the image sensor chip in the Y-axis direction is 4.878 mm to 5.038 mm, the Y-axis direction being perpendicular to the X-axis direction; and a width of the active pixel sensor region in the Y-axis direction is 4.048 mm to 4.308 mm.

14. The image sensor package as claimed in claim 13, wherein the non-sensing region has a length in the X-axis direction of 345 μm to 435 μm and a width in the Y-axis direction of 345 μm to 435 μm.

15. The image sensor package as claimed in claim 13, wherein:

the first bonding dam surrounds the active pixel sensor region;

the second and third bonding dams have a height of 50 μm to 150 μm from the image sensor chip, and the second and third bonding dams have a width of 160 μm to 240 μm.

16. The image sensor package as claimed in claim 15, wherein the third fourth bonding dam:

has a height of 50 μm to 150 μm from the image sensor chip, and a width in the X-axis direction or Y-axis direction of 160 μm to 240 μm.

\* \* \* \* \*